(12) United States Patent
Dening et al.

(10) Patent No.: US 6,525,611 B1
(45) Date of Patent: Feb. 25, 2003

(54) POWER AMPLIFIER PROTECTION

(75) Inventors: David C. Dening, Stokesdale, NC (US); Kathleen Muhonen, Greensboro, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 09/920,054

(22) Filed: Aug. 1, 2001

(51) Int. Cl.[7] ................................................. H02H 7/20
(52) U.S. Cl. ....................... 330/298; 330/285; 330/279; 330/207 P
(58) Field of Search ............................. 330/207 P, 279, 330/285, 298

(56) References Cited

U.S. PATENT DOCUMENTS

| | | | | |
|---|---|---|---|---|
| 5,179,353 A | * | 1/1993 | Miyake | 330/129 |
| 5,451,901 A | * | 9/1995 | Welland | 330/133 |
| 6,208,209 B1 | * | 3/2001 | Wg | 330/279 |

FOREIGN PATENT DOCUMENTS

| | | | | |
|---|---|---|---|---|
| JP | | 86377 | * 3/1994 | 330/207 P |

OTHER PUBLICATIONS

Pusl, Joe and Sridharan, Srikanth, "SiGe Power Amplifier ICs with SWR Protection for Handset Applications," Microwave Journal, Jun., 2001.

* cited by examiner

Primary Examiner—Michael B Shingleton
(74) Attorney, Agent, or Firm—Withrow & Terranova, PLLC

(57) ABSTRACT

The present invention provides circuitry for detecting excessive voltages at the output of a power amplifier and reducing the bias provided to the amplifier upon detecting excessive voltages. By reducing the amplifier bias, the amplifier's gain is reduced, which will effectively suppress the output voltages until the excessive voltage condition is removed. Peak detection circuitry is adapted to monitor the voltages of a radio frequency (RF) signal at the device output. When voltages for the RF output signal exceed a predefined threshold, the peak detection circuitry will provide an appropriate bias control signal to a bias network for the amplifier circuitry. The bias network is preferably configured to respond to the bias control signal by reducing the bias provided to the amplifier circuitry, thereby reducing the gain of the amplifier circuitry.

19 Claims, 4 Drawing Sheets

POWER AMPLIFIER PROTECTION

FIELD OF THE INVENTION

The present invention relates to power amplifiers for amplifying radio frequency signals, and in particular, protecting such power amplifiers from breakdown due to excessively high output voltages.

BACKGROUND OF THE INVENTION

Power amplifiers for wireless communication applications are often subjected to elevated voltages and extreme voltage standing wave ratios (VSWRs). These power amplifiers are preferably constructed using an array of Gallium Arsenide or like heterojunction bipolar transistors (HBTs), which are known to break down under such elevated voltages and extreme VSWRs. For example, the base collector breakdown voltage for a two micron HBT process is approximately 24 volts, wherein the collector emitter breakdown voltage is significantly less, at approximately 14 volts. Even when power supply voltages are significantly less than either of these breakdown voltages, leakage currents entering the base regions of the transistors experience beta multiplication if they are not provided with a good path to ground through the base contact.

Breakdown problems typically occur during portions of the radio frequency cycle just before and after transistor conduction. When the output device is not conducting and the collector current is close to zero, the collector voltage exhibits a "ringing" phenomenon. The waveform for the collector voltage is influenced by a number of factors, such as: the matching network, the compression state of the amplifier, the amplifier bias, the low output impedance at the output of the amplifier, and the termination of any harmonics. FIG. 1 illustrates the excessive collector voltages ($V_C$) when the collector current ($I_C$) for an HBT approaches zero. The corresponding base voltages ($V_B$) are also provided. For the simulation represented in FIG. 1, the power supply voltage is 3.5 volts; however, the peak voltages at the collector will often exceed twice the power supply voltage under normal conditions when the collector current is close to zero. Under extreme VSWR conditions, the voltages can exceed three times the supply voltage. In the example of FIG. 1, the first and third collector voltage peaks in each cycle occur when the base node has not been pulled to ground, but is biased at a point where the collector current is biased off. Hence, the base emitter voltage applied to the device is not capable of expelling charges introduced into the base region. At these points in the radio frequency (RF) cycle, the device breakdown is probably closer to the collector emitter voltage thresholds than the more optimistic collector base breakdown voltages.

When the transistor is subjected to extreme VSWR conditions, the fundamental signal and associated harmonics are reflected back to the collector of the output transistor. As the phase is rotated around the Smith chart, the collector waveform during the portion of the cycle when the transistor is off will experience various conditions of constructive interference. Likewise, there is a good chance that these peaks will occur when the base has not been effectively grounded. Thus, under elevated supply voltages, such as 5 volts, the collector emitter breakdown voltage of the device may be exceeded.

FIG. 2 illustrates this phenomenon. A mismatched load on the transistor may trigger sub-harmonic oscillations in the bias network, which leads to significant variations in collector current ($I_C$) from cycle to cycle. For a supply voltage of 3.5 volts, the peak collector voltage ($V_C$) may reach 12 volts. Further, the peak collector voltage ($V_C$) occurs just as the base voltage ($V_B$) is approaching the base emitter threshold, which turns the device on. At this point in the cycle, any leakage current at the base collector junction of the transistor will see beta multiplication. The added power dissipation in the device in this example will be the beta multiplied leakage current times almost 12.0 volts, which could lead to a catastrophic failure of the device.

The output load mismatches that can lead to such conditions may be induced by a user simply touching the antenna of a mobile telephone. Essentially, the act of touching the antenna changes the output load impedance for the device, which may lead to extreme VSWR conditions and excessive voltage peaks on the collectors of the output transistors. Given the relative ease in which such conditions are induced, there is a need for a way to protect the power amplifier circuitry from these conditions in an efficient and cost-effective manner.

SUMMARY OF THE INVENTION

The present invention provides circuitry for detecting excessive voltages at the output of a power amplifier and reducing the bias provided to the amplifier upon detecting excessive voltages. By reducing the amplifier bias, the amplifier's gain is reduced, which will effectively suppress the output voltages until the excessive voltage condition is removed. Peak detection circuitry is adapted to monitor the voltages of a radio frequency (RF) signal at the device output. When voltages for the RF output signal exceed a predefined threshold, the peak detection circuitry will provide an appropriate bias control signal to a bias network for the amplifier circuitry. The bias network is preferably configured to respond to the bias control signal by reducing the bias provided to the amplifier circuitry, thereby reducing the gain of the amplifier circuitry.

Preferably, the amount the normal bias is suppressed is multiplied by the amount the output voltage for the RF output signal exceeds the defined threshold, in order to quickly respond and compensate for the over-voltage condition. The bias signal controlling the gain of the amplifier circuitry may be adjusted using a number of techniques. For example, peak detection circuitry may be configured to reduce the amplifier bias current, or provide a select gain to the bias control proportional to the over-voltage condition.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
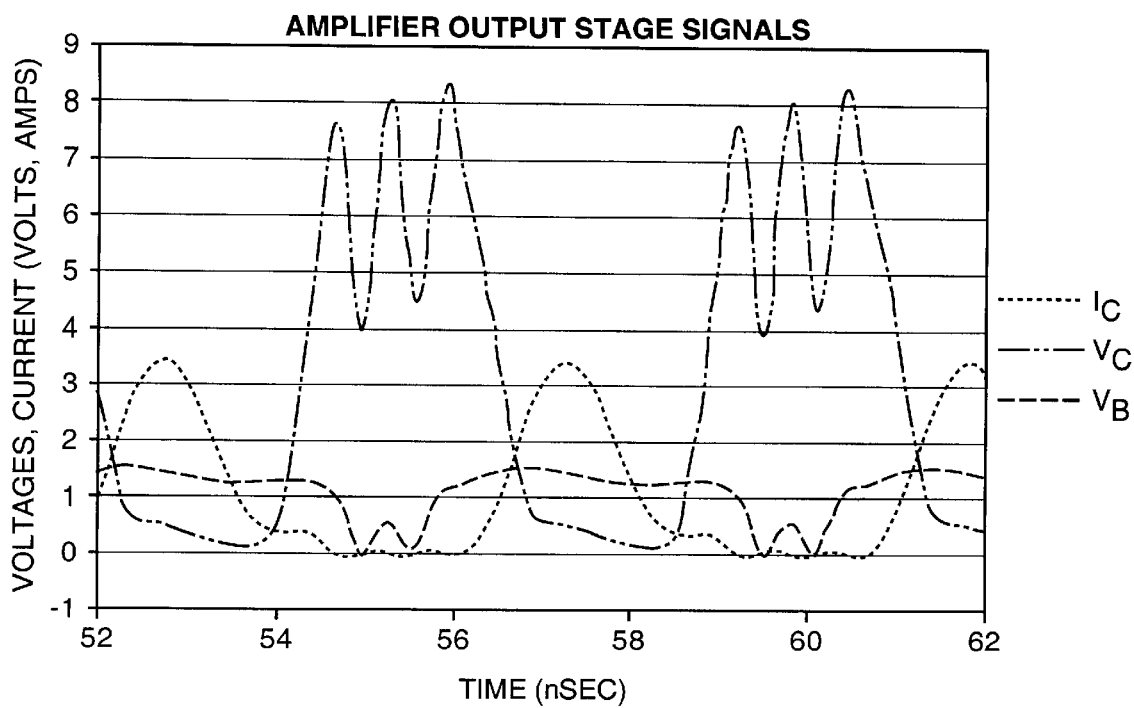
FIG. 1 is a graph illustrating base voltages, collector voltages, and collector currents for a transistor power amplifier of prior art devices, with peak collector voltages significantly higher than the power supply voltage.
Figure 2:
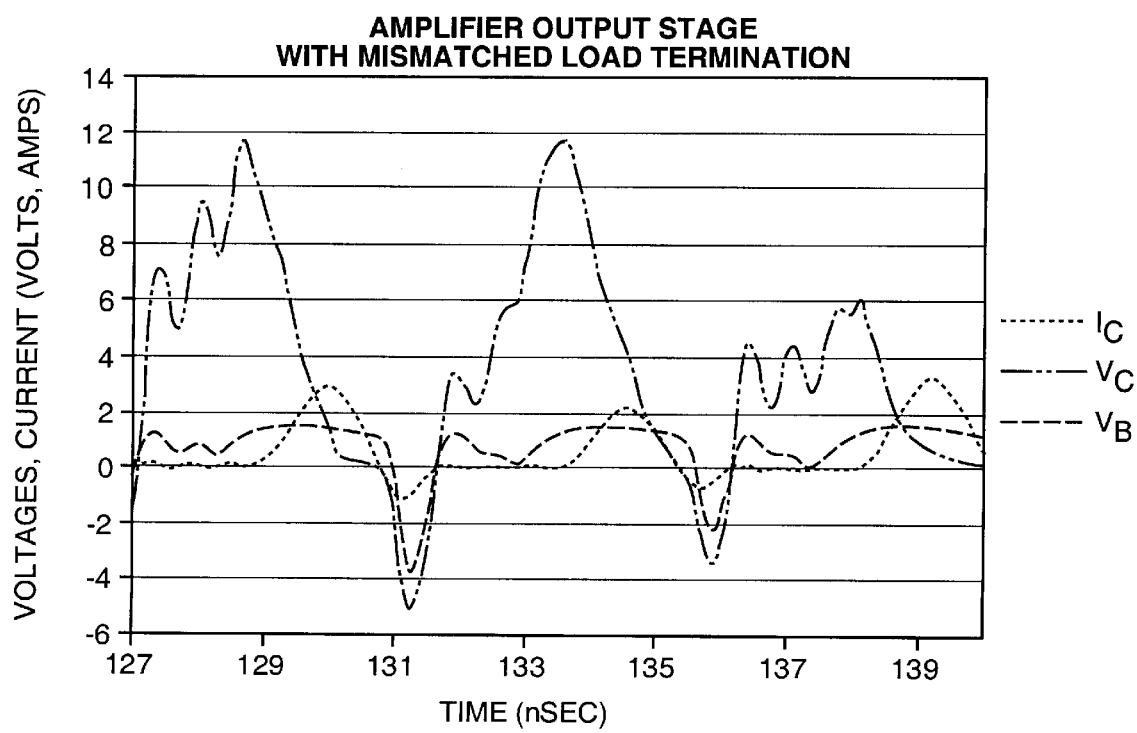
FIG. 2 is a graph illustrating base voltages, collector voltages, and collector currents for a transistor power amplifier of prior art devices, with an extreme mismatch on low termination.
Figure 3:
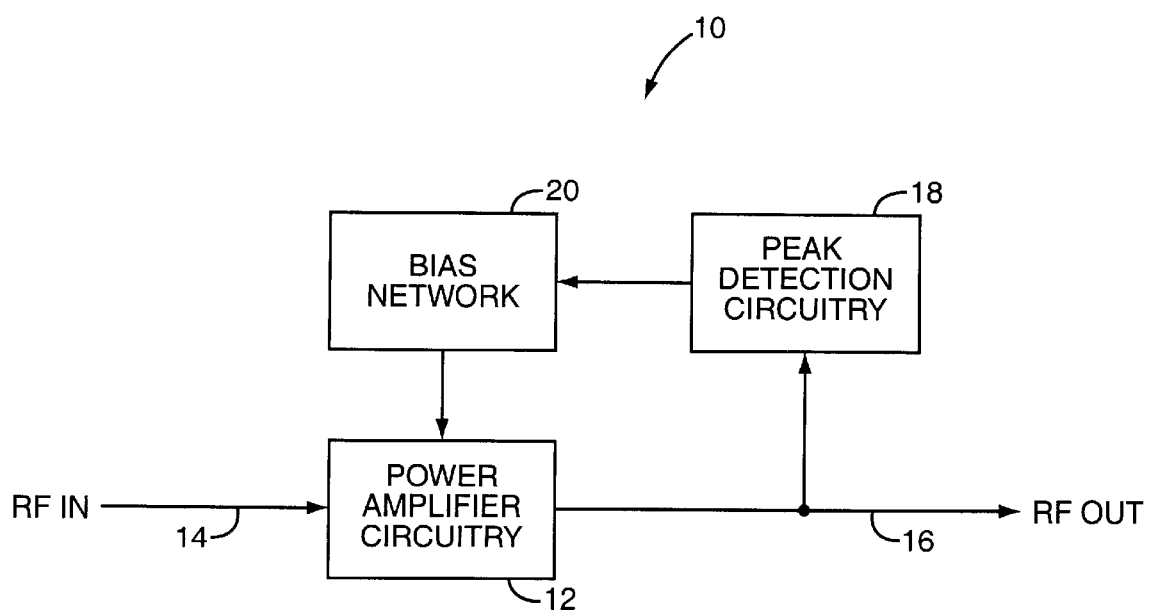
FIG. 3 is a block schematic of the present invention.

The present invention provides circuitry for detecting excessive voltages at the output of a power amplifier and reducing the bias provided to the amplifier when excessive voltages are detected. By reducing the amplifier bias, the amplifier's gain is reduced, which will effectively suppress the output voltages until the excessive voltage condition is removed. FIG. 3 illustrates an amplifier 10 incorporating the basic concepts of the present invention wherein power amplifier circuitry 12, which is typically implemented using transistors, such as Gallium Arsenide (GaAs) heterojunction bipolar transistors (HBTs), amplifies a radio frequency (RF) input signal (RF IN) 14 to provide an amplified RF output signal (RF OUT) 16. Those skilled in the art will recognize that other transistor technologies, including silicon, silicon germanium, and gallium nitrite, will benefit from this invention. Further, field effect transistors (FETs) are also applicable. Peak detection circuitry 18 will monitor the voltages of the RF output signal 16. When voltages for the RF output signal 16 exceed a predefined threshold, the peak detection circuitry 18 will provide an appropriate signal to a bias network 20 for the power amplifier circuitry 12. The bias network 20 is preferably configured to respond to the signal provided by the peak detection circuitry 18 by reducing the bias provided to the power amplifier circuitry 12 and thereby reduce the gain for the power amplifier circuitry 12.

Typically, the bias network 20 is either fixed or controlled to provide optimized amplifier operation and gain under normal conditions. When the output voltages exceed the defined thresholds as determined by the peak detection circuitry 18, the bias network 20 reduces the bias provided to the power amplifier circuitry 12. Preferably, the amount the normal bias is suppressed is proportionally multiplied by the amount the output voltages exceed the defined threshold, in order to quickly respond to and compensate for the over-voltage condition.

Upon understanding the concepts of the present invention, those skilled in the art will recognize several techniques for detecting excessive voltages and controlling amplifier bias accordingly. A preferred embodiment is illustrated in FIG. 4; however, the teachings herein and the scope of the following claims are not limited to this exemplary embodiment.

Figure 4:
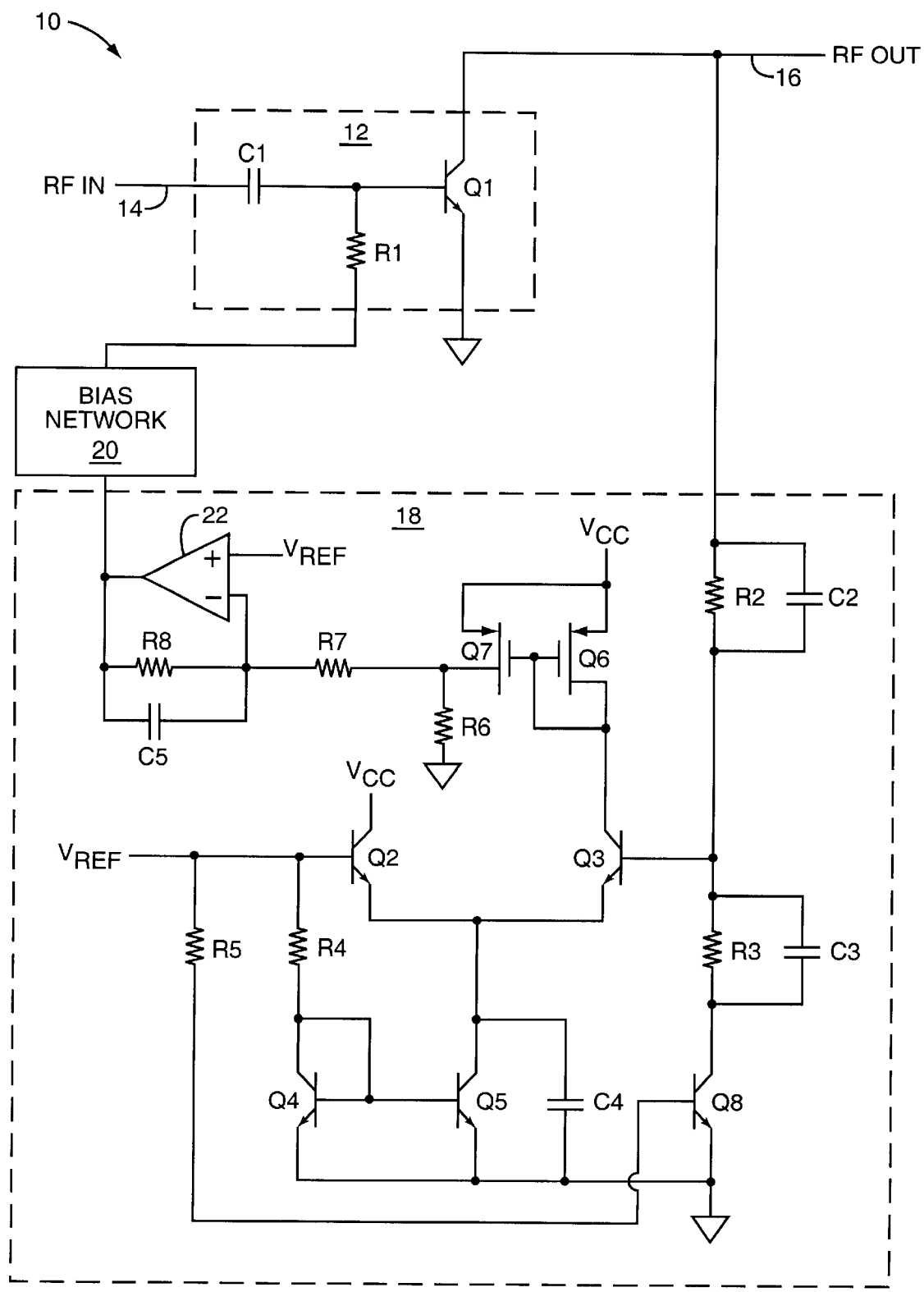
FIG. 4 is an exemplary embodiment of the present invention.

As illustrated in FIG. 4, the RF input signal 14 is amplified by amplifier circuitry 12 to produce an RF output signal 16. The amplifier circuitry 12 will preferably include a network of resistors, capacitors, and HBTs, represented by capacitor C1, resistor R1, and transistor Q1. The preferred operation and configuration of the amplifier circuitry 12 is illustrated in greater detail in U.S. Pat. No. 5,608,353, HBT POWER AMPLIFIER, issued Mar. 4, 1997; and U.S. Pat. No. 5,629,648, HBT POWER AMPLIFIER, issued May 13, 1997, which are assigned to RF Micro Devices, Inc. of 7628 Thorndike Road, Greensboro, N.C. 27409, and wherein the disclosures are incorporated herein by reference in their entirety. As illustrated, the RF input signal 14 is delivered to capacitor C1, and a DC bias is provided by the bias network 20 via resistor R1. The bias network 20 is configured to provide optimal bias through resistor R1 to transistor Q1 under normal operating conditions and adjust the bias based on the bias control signal provided by the peak detection circuitry 18. For the purposes of discussion, the capacitor, resistor, and transistor arrays represented by capacitor C1, resistor R1, and transistor Q1 are discussed as a single entity, but are typically multiple-component networks or arrays.

The peak detection circuitry 18 is configured to monitor the voltage at the collector for transistor Q1. The voltage at the collector of transistor Q1 is or is representative of the voltage of the RF output signal 16. Those skilled in the art will recognize that additional passive and active components may be present in a transmission path between the collector of transistor Q1 and the point from which RF OUT 16 is monitored by the peak detection circuitry 18.

The peak detection circuitry 18 is configured to detect collector voltages exceeding a defined threshold. As illustrated, the peak detection circuitry 18 includes transistors Q2 through Q8, resistors R2 through R8, and capacitors C2 through C5. Additionally, a power supply voltage ($V_{CC}$) and a reference voltage ($V_{REF}$) are provided in traditional fashion. Assume for the purposes of illustration that $V_{CC}$ is approximately 3.5 volts, and $V_{REF}$ is set to 2.5 volts. Those skilled in the art will also recognize that additional components and elements may be necessary for circuit operation, but that the components illustrated are the primary ones affecting operation of the peak detection circuitry 18.

Since transistor Q8 is always biased on via $V_{REF}$ through resistor R5, resistors R2 and R3 and related capacitors C2 and C3 form a voltage divider for the voltages of the collector of transistor Q1 at the base of transistor Q3. The voltage divider is essentially compared to $V_{REF}$ using the current steering circuitry implemented by transistors Q2 and Q3. The defined threshold for this example was 12.5 volts, and the voltage divider was set to divide the voltage at the collector of transistor Q1 by a factor of five. Assuming that the voltage divider is set such that the excessive voltage threshold for the RF output signal 16 results in a divider voltage at the base of collector Q3 approximately equal to $V_{REF}$, or 2.5 volts, transistor Q3 will conduct during excessive voltage conditions. In normal operation, transistor Q3 does not conduct, and transistor Q2 is biased to an on state. Further, transistor Q4 will operate so that transistor Q5 can provide a constant current sink. Normally, the collector of transistor Q5 has a voltage that is essentially $V_{REF}$ minus the base-emitter voltage for transistor Q2. As such, capacitor C4 is charged to a corresponding voltage.

In essence, transistors Q2 and Q3 form a differential pair biased by transistor Q5. When an excessive voltage causes the voltage divider to provide a base voltage greater than $V_{REF}$ to the base of transistor Q3, transistor Q3 will turn on and transistor Q2 will turn off. As such, transistor Q3 will add additional charge to capacitor C4 corresponding to the difference in the divider voltage and $V_{REF}$. Since transistor Q5 is a current sink, the additional current necessary to charge capacitor C4 effectively multiplies the amount of current provided through the collector and emitter of transistor Q3. The collector current of transistor Q3 is processed and used to control the bias network 20, as will be discussed in greater detail below. During the over-voltage condition, transistor Q3 will remain on.

When the over-voltage condition ceases, the divider voltage provided to the base of transistor Q3 will effectively drop below $V_{REF}$, causing transistor Q3 to turn off and transistor Q2 to subsequently turn on. Notably, when capacitor C4 is present, there is a period where the charge stored in capacitor C4 is discharged through transistor Q5 until the emitter voltage for transistor Q2 drops sufficiently to properly bias transistor Q2. Once the voltage across capacitor C4 drops to a sufficient level, transistor Q2 will conduct. As noted, transistor Q3 is turned off, and any supplemental bias control for the excessive voltage condition to control the bias network 20 is removed.

In summary, excessive voltage conditions trigger current flow through transistor Q3. When capacitor C4 is used, the proportion of current flowing through transistor Q3 is effectively increased in proportion to the amount the RF output signal voltage exceeds the defined threshold. The invention is operable without providing such increase through the use of capacitor C4 or like circuitry, however, it is preferable to reduce the bias provided to the amplifier circuitry 12 quickly and to a greater degree than the excessive voltage condition.

As noted, the current through transistor Q3 corresponds to excessive voltage conditions and is a function, and preferably a multiple, thereof. The collector of transistor Q3 is connected to a current mirror configuration provided by transistors Q6 and Q7. Essentially, any current through transistor Q6 is mirrored through transistor Q7. Since the current through transistor Q6 is essentially the current through transistor Q3, transistor Q7 will conduct current proportional to that for the over-voltage conditions. The output of transistor Q7 is coupled to ground through resistor R6, and to an inverting input of an operational amplifier 22 through resistor R7. The non-inverting input of the operational amplifier 22 is coupled to $V_{REF}$. In effect, a voltage divider is provided at the inverting input of the operational amplifier 22 between the output of transistor Q7 and the output of the operational amplifier 22 with resistors R7 and R8. Capacitor C5 is provided in the non-inverting feedback loop for the operational amplifier 22 to enhance stability of the control loop.

Since the operational amplifier 22 maintains the inverting and non-inverting inputs at $V_{REF}$, additional current through transistor Q7 is channeled through resistor R6 in addition to the voltage divider current through R7. The result is an additional voltage drop and a reduced voltage at the output of the operational amplifier 22 when the voltages of the RF output signal 16 exceed the defined threshold. As illustrated, the output of operational amplifier 22 is provided to the bias network 20 and is used to reduce the bias provided to the amplifier circuitry 12. The bias network 20 may take this supplemental bias control voltage and subtract it from the bias voltage provided to the amplifier circuitry 12, those skilled in the art will recognize that the resultant supplementary bias control signal may be structured as a voltage or a current and subtracted from the corresponding bias signal or otherwise processed to reduce the bias current using various techniques. Exemplary bias networks 20 capable of being used in association with the present invention are described in further detail in U.S. patent application Ser. No. 09/467,415, entitled BIAS NETWORK FOR HIGH EFFICIENCY RF LINEAR POWER AMPLIFIER, filed Dec. 20, 1999, currently pending, the disclosure of which is incorporated herein by reference in its entirety.

Component values for the exemplary peak detection circuitry of FIG. 4 are as follows:

| R2 | 8.0 Kohms | C2 | 0.25 pF |
| R3 | 2.0 Kohms | C3 | 1.0 pF |
| R4 | 1.0 Kohms | C4 | 1.0 pF |
| R5 | 4.0 Kohms | C5 | 1.0 nF |
| R6 | 110 Kohms | | |
| R7 | 110 Kohms | | |
| R8 | 330 Kohms | | |

Figure 5:
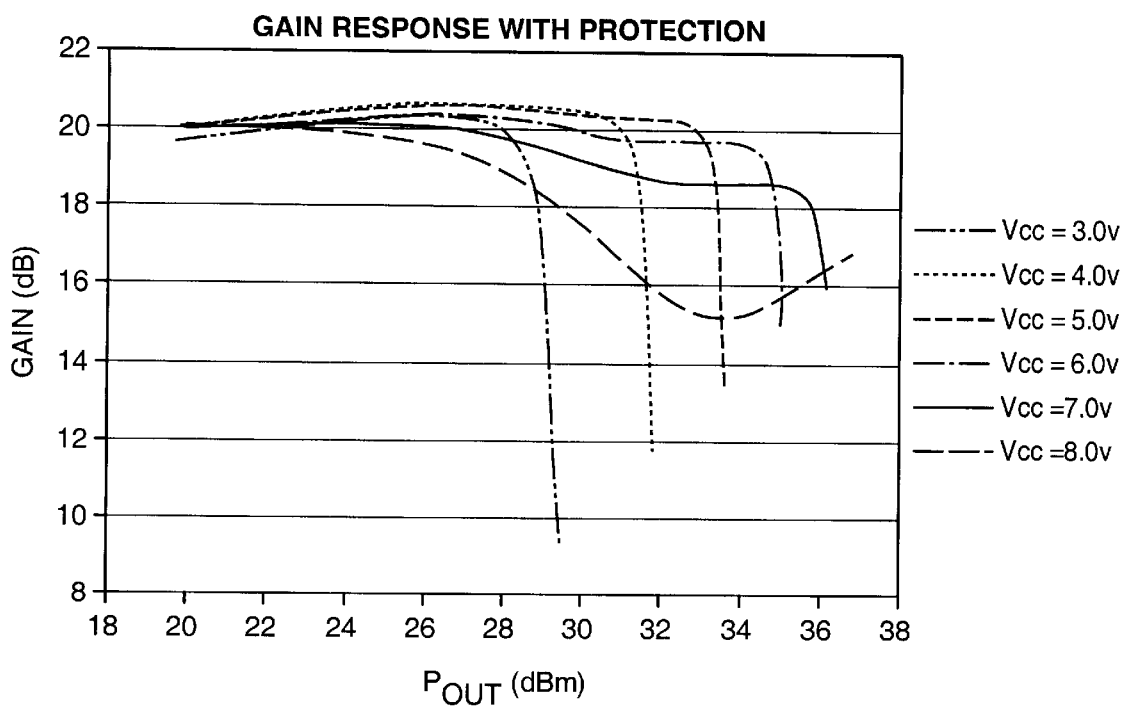
FIG. 5 is a graph illustrating the gain response for a power amplifier under control of the peak detection circuitry of the present invention.
Figure 6:
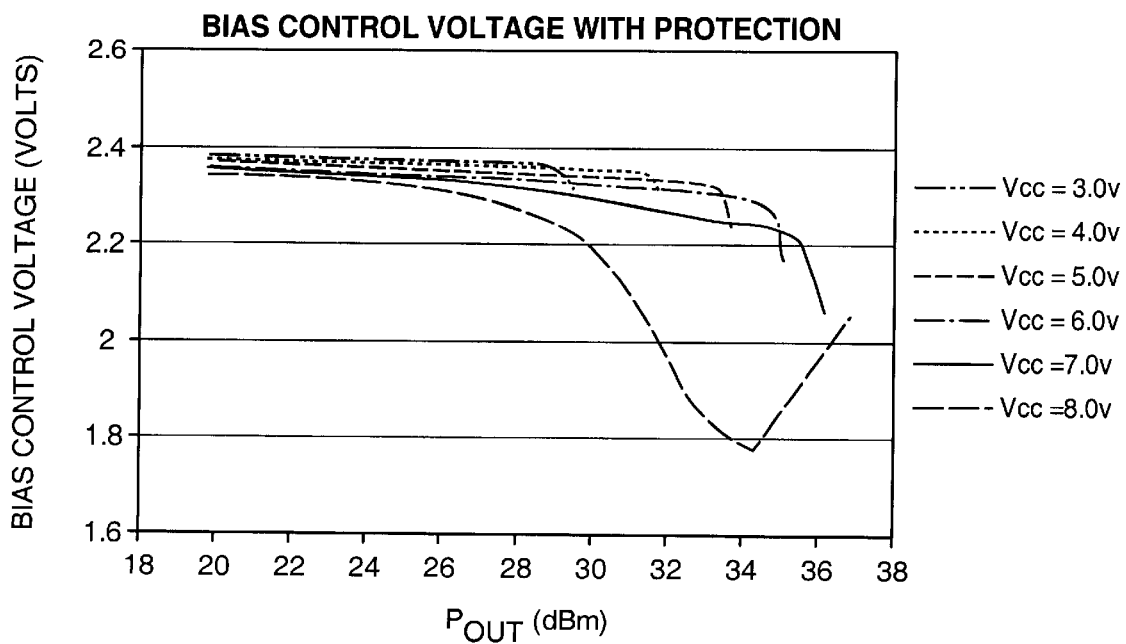
FIG. 6 is a graph illustrating bias control voltages generated by the peak control circuitry of the present invention.

FIGS. 5 and 6 illustrate the improved performance of the power amplifier when operated in association with the peak detection circuitry 18 and an appropriately configured bias network 20. During testing, the power amplifier circuitry 12 was tuned to 900 MHz, with an inter-stage impedance tuned for as low an impedance as possible to provide sufficient output stage drive. The resulting gain was approximately 20 dB. To verify the loop performance of the present invention, a series of power sweeps were employed with varying power supply voltages ($V_{CC}$). For one-volt increments between 3.0 volts and 8.0 volts, input power was swept from 0 dBm to 20 dBm to ensure saturation. During testing, the power amplifier circuitry 12 maintained sufficient drive for the output load, since the saturated output power increases with the increases in the supply voltage. When $V_{CC}$ equaled 6.0 volts, the gain was reduced at output powers above 30 dBm. At higher $V_{CC}$ voltages, the gain is further reduced. The highly compressed saturated output power continues to increase with increasing $V_{CC}$. It is believed that the circuit could contain even higher supply voltages than 8.0 volts. The collector waveform for transistor Q1 becomes more benign when the transistor enters saturation, which is believed to be the reason for the large displacement of the last data point.

As shown in FIG. 6, the bias control voltage is reduced at higher power supply voltages. Also, as the power amplifier circuitry 12 enters saturation, the bias voltage is reduced.

Those skilled in the art will recognize improvements and modifications to the preferred embodiments of the present invention. All such improvements and modifications are considered within the scope of the concepts disclosed herein and the claims that follow.

What is claimed is:

1. An amplifier with protection for over-voltage conditions comprising:

a) amplifier circuitry adapted to amplify a radio frequency (RF) inuput signal to provide an RF output signal wherein the amplifier circuitry has a gain controlled by a bias signal;

b) a voltage divider adapted to divide the RF output signal and provide a divided output signal for comparison with a voltage reference corresponding to a voltage threshold;

c) a current mirror generating an over-voltage current corresponding to the amount the divided output signal exceeds the voltage reference;

d) operational amplifier circuitry adapted to process the over-voltage current to generate a bias control signal when the RF output signal exceeds the voltage threshold; and e) a bias network adapted to generate the bias signal to control the gain of the amplifier circuitry and reduce the bias signal as a function of the bias control signal wherein the bias signal is reduced to reduce the gain of the amplifier circuitry when the RF output signal exceeds the voltage threshold.

2. The amplifier of claim 1 wherein the peak detection circuitry is further adapted to generate the bias control signal to have a magnitude of greater proportion than the amount the RF output signal exceeds the voltage threshold.

3. The amplifier of claim 1 wherein the bias network is further adapted to reduce the bias signal to a degree greater than the amount the RF output signal exceeds the voltage threshold.

4. The amplifier of claim 1 wherein the amplifier circuitry includes a bipolar transistor network wherein the RF output signal is generated at the collector of at least one bipolar transistor in the bipolar transistor network.

5. The amplifier of claim 4 wherein the at least one bipolar transistor is a heterojunction bipolar transistor.

6. The amplifier of claim 5 wherein the herterojunction bipolar transistor is a gallium arsenide bipolar transistor.

7. A method for protecting amplifier circuitry from over-voltage conditions comprising:
   a) amplifying a radio frequency (RF) input signal to provide an RF output signal according to a gain controlled by a bias signal;
   b) monitoring the RF output signal;
   c) dividing the RF output signal to create a divided output signal;
   d) comparing the divided output signal with a voltage reference corresponding to a voltage threshold;
   e) generating an over-voltage current corresponding to the amount the divided output signal exceeds the voltage reference;
   f) processing the over-voltage current to generate the bias control signal when the RF output signal exceeds the voltage threshold; and
   g) reducing the bias signal as a function of the bias control signal wherein the bias signal is reduced to reduce the gain of amplification when the RF output signal exceeds the voltage threshold.

8. The method of claim 7 wherein the bias signal is reduced to a degree greater than the amount the RF output signal exceeds the voltage threshold.

9. An amplifier with protection for over-voltage conditions comprising:
   a) amplifier circuitry adapted to amplify a radio frequency (RF) input signal to provide an RF output signal wherein the amplifier circuitry has a gain controlled by a bias signal; and
   b) circuitry comprising:
      i) a voltage divider adapted to divide the RF output signal and provide a divided output signal for comparison with a voltage reference corresponding to a voltage threshold,
      ii) bias control signal generation circuitry adapted to generate a bias control signal based on the amount the divided output signal exceeds the voltage reference;
      iii) a current mirror generating an over-voltage current corresponding to the amount the divided output signal exceeds the voltage reference; and
      iv) operational amplifier circuitry adapted to process the over-voltage current to generate the bias control signal when the RF output signal exceeds the voltage threshold.

10. The amplifier of claim 9 wherein the circuitry is further adapted to generate the bias control signal to have a magnitude of greater proportion than the amount the RF output signal exceeds the voltage threshold.

11. The amplifier of claim 9 wherein the circuitry is further adapted to reduce the bias signal to a degree greater than the amount the RF output signal exceeds the voltage threshold.

12. The amplifier of claim 9 wherein the amplifier circuitry includes a bipolar transistor network wherein the RF output signal is generated at the collector of at least one bipolar transistor in the bipolar transistor network.

13. The amplifier of claim 12 wherein the at least one bipolar transistor is a heterojunction bipolar transistor.

14. The amplifier of claim 13 wherein the heterojunction bipolar transistor is a gallium arsenide bipolar transistor.

15. A system for protecting amplifier circuitry from over-voltage conditions comprising:
   a) means for amplifying a radio frequency (RF) input signal to provide an RF output signal according to a gain controlled by a bias signal;
   b) means for monitoring the RF output signal;
   c) means for dividing the RF output signal to create a divided output signal;
   d) means for comparing the divided output signal with a voltage reference corresponding to a voltage threshold;
   e) means for generating an over-voltage current corresponding to the amount the divided output signal exceeds the voltage reference;
   f) means for processing the over-voltage current to generate the bias control signal when the RF output signal exceeds the voltage threshold; and
   g) means for reducing the bias signal as a function of the bias control signal wherein the bias signal is reduced to reduce the gain of amplification when the RF output signal exceeds the voltage threshold.

16. The system of claim 5 wherein the bias signal is reduced to a degree greater than the amount the RF output signal exceeds the voltage threshold.

17. Bias control circuitry for protecting an amplifier from over-voltage conditions comprising:
   a) means for receiving a radio frequency (RF) output signal from the output of an amplifier;
   b) means for dividing the RF output signal to create a divided output signal;
   c) means for comparing the divided output signal with a voltage reference corresponding to a voltage threshold;
   d) means for generating an over-voltage current corresponding to the amount the divided output signal exceeds the voltage reference;
   e) means for processing the over-voltage current to generate the bias control signal when the RF output signal exceeds the voltage threshold; and
   f) means for reducing the bias signal controlling the gain of the amplifier as a function of the bias control signal wherein the bias signal is reduced to reduce the gain of the amplifier circuitry when the RF output signal exceeds the voltage threshold.

18. The bias control circuitry of claim 17 wherein the means for generating the bias control signal is further adapted to generate the bias control signal to have a magnitude of greater proportion than the amount the RF output signal exceeds the voltage threshold.

19. The bias control circuitry of claim 17 wherein the means for generating the bias control signal is further adapted to reduce the bias signal to a degree greater than the amount the RF output signal exceeds the voltage threshold.

* * * * *